(12) United States Patent
Masuda

(10) Patent No.: US 12,255,261 B2
(45) Date of Patent: Mar. 18, 2025

(54) SOLAR PANEL

(71) Applicant: TOYOTA JIDOSHA KABUSHIKI KAISHA, Toyota (JP)

(72) Inventor: Taizo Masuda, Yokohama (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 118 days.

(21) Appl. No.: 18/124,839

(22) Filed: Mar. 22, 2023

(65) Prior Publication Data

US 2023/0369523 A1 Nov. 16, 2023

(30) Foreign Application Priority Data

May 12, 2022 (JP) ................................. 2022-078681

(51) Int. Cl.
*H01L 31/05* (2014.01)
*H01L 31/044* (2014.01)

(52) U.S. Cl.
CPC ........ *H01L 31/0516* (2013.01); *H01L 31/044* (2014.12)

(58) Field of Classification Search
CPC .......................... H01L 31/0516; H01L 31/044
See application file for complete search history.

(56) References Cited

U.S. PATENT DOCUMENTS

| | | | |
|---|---|---|---|
| 2012/0125391 | A1 | 5/2012 | Pinarbasi et al. |
| 2012/0318318 | A1 | 12/2012 | Metin et al. |
| 2015/0349167 | A1 | 12/2015 | Morad et al. |
| 2021/0226076 | A1 | 7/2021 | Yuan et al. |
| 2022/0069147 | A1* | 3/2022 | Pieters ................ H01L 31/0443 |

FOREIGN PATENT DOCUMENTS

| | | |
|---|---|---|
| CN | 104600141 A | 5/2015 |
| JP | 2021-082722 A | 5/2021 |
| JP | 2021-530877 A | 11/2021 |
| WO | 2020/031574 A1 | 2/2020 |

\* cited by examiner

*Primary Examiner* — Devina Pillay
(74) *Attorney, Agent, or Firm* — Oliff PLC

(57) ABSTRACT

A solar panel includes: a cell group in which a plurality of solar cells is arranged in one direction; and a connecting element for electrically connecting the solar cells to each other. Among the solar cells arranged adjacent to each other, an edge portion of a front surface of a first solar cell is arranged so as to overlap an edge portion of a back surface of a second solar cell. The connecting element is arranged between the overlapping edge portions and on the back surface of the solar cells. The cell group includes a plurality of parallel connection regions in which at least two solar cells are electrically connected in parallel. The parallel connection regions are electrically connected in series.

4 Claims, 4 Drawing Sheets

SOLAR PANEL

CROSS-REFERENCE TO RELATED APPLICATION

This application claims priority to Japanese Patent Application No. 2022-078681 filed on May 12, 2022, incorporated herein by reference in its entirety.

BACKGROUND

1. Technical Field

The present disclosure relates to a solar panel, and more particularly to a solar panel configured so that as many solar cells as possible can be arranged without any gaps within a certain limited area.

2. Description of Related Art

In order to achieve carbon neutrality, attempts are being made to install solar panels on the roofs or the like of vehicles such as automobiles or other moving bodies, and to use the solar energy obtained thereby to drive the vehicles. When installing a solar panel on the roof or the like of such a moving body, the area in which the solar panel can be disposed is limited. In order to collect as much solar energy as possible in a certain limited area to obtain an amount of power generation, various proposals have been made on configurations that enable as many solar cells as possible to be arranged without gaps in the panel.

For example, in Japanese Unexamined Patent Application Publication No. 2021-082722 (JP 2021-082722 A), WO 2020/031574, etc., a plurality of solar cells is arranged side by side in one direction in a panel. The solar cells are arranged so that the surface on the back side (back surface) of a certain solar cell partially overlaps the edge of the surface on the front side (front surface) of an adjacent solar cell. At the overlapped portion, the adjacent solar cells are electrically connected via conductive members. It has been proposed to use this "shingling structure" or "shingling method" (see FIG. 4A). In particular, JP 2021-082722 A proposes an arrangement configuration that can suppress a decrease in the output when arranging a plurality of solar cells with different power generation areas in a configuration in which a plurality of cells arranged in the shingling structure is connected in series.

Further, in WO 2020/031574, a plurality of configurations (strings) in which a plurality of solar cells is connected in series and arranged with the shingling method is arranged in a direction intersecting the arrangement direction of the solar cells. A common member is used to electrically connect adjacent solar cells in each string. Each cell is connected in series with another cell in one string and is connected in parallel with the corresponding cell in another string. It is described that this configuration can be expected to suppress output reduction due to mismatch of the current between a plurality of strings.

SUMMARY

In a solar panel, for example, if the entire surface of the area where sunlight reaches (sunlight reaching area) is covered with a single solar cell (hereinafter referred to as "cell"), the generated voltage is low, but the generated current increases, which increases the amount of heat generated (Joule heat). In order to avoid this, as described above, a configuration is adopted in which a plurality of cells is arranged in the sunlight reaching area and connected in series to increase the generated voltage in the panel and decrease the generated current. In addition, rather than forming a single cell that entirely covers the sunlight reaching area, arranging a plurality of small-area cells side by side in accordance with the shape of the sunlight reaching area is advantageous in that it can facilitate work and operation in manufacturing and installing solar panels and the like. In this case, when the shingling structure described above is adopted, a plurality of cells can be arranged almost without gaps in the sunlight reaching area. Therefore, substantially the entire sunlight reaching area is covered with the light receiving surfaces of the cells, which makes it possible to obtain as much solar energy as possible from the panel as electrical energy.

The solar panel adopting the shingling structure as described above typically consists of a plurality of cells arranged along one direction and electrically connected in series, in other words, a group of cells called "strings". One or more cell groups are arranged to cover the entire sunlight reaching area of the panel. In this case, all cells are connected in series in each cell group. Accordingly, the magnitude of the generated current obtained in each cell group is limited to the magnitude of the generated current in the cell having the smallest generated current among the cells in the cell group. Therefore, when a partial shadow is formed in the sunlight reaching area of the panel and the amount of light received by some cells is reduced, the generated current of the cells with the reduced amount of light is reduced. This is because the generated current of each cell increases or decreases in accordance with the increase or decrease in the amount of light received by each cell. Therefore, the generated current obtained from the cell group to which the cell belongs is also reduced. For example, if the entire surface of a cell is in partial shadow, current will not flow through that cell. Thus, no current flows through the cell group to which the cell belongs. In addition, as shown in FIG. 5A, in a solar panel with the shingling structure, the sunlight reaching area is covered with a plurality of cells. That is, the area of the light receiving surface of each cell is smaller than the sunlight reaching area of the panel. When a partial shadow of a certain size occurs in one cell, the smaller the light receiving area of the cell, the greater the decrease rate of the current. Therefore, in a cell group with the shingling structure in which all the cells are connected in series, the decrease rate of the generated current when a certain partial shadow occurs will be larger than the decrease rate of the generated current when the same partial shadow occurs in a cell with the same area of the above cell group. Furthermore, as shown in FIG. 5B, with a plurality of cell groups in the form of strings having shingling structures arranged side by side in a solar panel, if an elongated shadow that covers one cell in each cell group (such as a shadow caused by trees or utility poles) occurs, when all the cells in each cell group are connected in series, current cannot be obtained in all cell groups and power cannot be taken out. Therefore, in a solar panel, in a configuration in which a plurality of cells is arranged in a so-called "shingling structure" over the sunlight reaching area, it is advantageous when, even if a partial shadow that covers one cell is formed, the generated current of other cells can be taken out from the cell group to which that cell belongs.

The present disclosure provides a solar panel configured such that, in a cell group in which a plurality of cells is arranged in a shingling structure, even if one cell is covered with a partial shadow, the current generated by the other cells can be taken out.

An aspect of the present disclosure is a solar panel including: a cell group in which a plurality of solar cells is arranged in one direction; and a connecting element for electrically connecting the solar cells to each other, in which among the solar cells arranged adjacent to each other, an edge portion of a front surface of a first solar cell is disposed so as to overlap on a lower side of an edge portion of a back surface of a second solar cell, the connecting element is disposed between the overlapping edge portions and on the back surface of the solar cells, the cell group includes a plurality of parallel connection regions in which at least two solar cells are electrically connected in parallel, and the parallel connection regions are electrically connected in series.

In the configuration of the present disclosure described above, the "solar cell" may be any type of solar cell commonly used in this field. As described above, in a "cell group" in which a plurality of such "solar cells" is arranged in one direction, among the solar cells arranged adjacent to each other, an edge portion of a front surface of a first solar cell is disposed so as to overlap on a lower side of an edge portion of a back surface of a second solar cell, which forms a so-called "shingling structure". In addition, substantially the entire area of the surface on the front side (front surface) of each solar cell may be a light receiving surface, except for the edge portion that overlaps the edge portion of the surface on the back side (back surface) of the adjacent solar cell. The edge portion overlapping the edge portion of the back surface of the adjacent solar cell may also be formed in the same manner as the light receiving surface. As a result, it is possible to form substantially the entire front surface of the cell group, which is the sunlight reaching area, to be the light receiving surface. It should be noted that a bypass diode may be connected in parallel across both ends of the cell group in the normal manner.

In the cell group of the solar panel of the present disclosure, the plurality of cells arranged in one direction is not all connected in series, but a plurality of parallel connection regions is formed in which at least two solar cells are electrically connected in parallel. The parallel connection regions are electrically connected in series. That is, between a plurality of cells arranged in one direction, a portion where adjacent cells are electrically connected in parallel and a portion where adjacent cells are electrically connected in series are formed. The adjacent cells being electrically connected in parallel means that the anodes and cathodes of the cells are electrically connected to each other. The adjacent cells being electrically connected in series means that the cathode of one of the adjacent cells is electrically connected to the anode of the other.

According to the configuration of the present disclosure described above, first, in a cell group, a plurality of cells is arranged in a shingling structure. Connecting elements that electrically connect the solar cells to each other are arranged between overlapping edge portions of adjacent cells and on the back surface of the solar cells. Therefore, it is possible to dispose the light receiving surface on the front side of the cell group over substantially the entire sunlight reaching area. This makes it possible for the cells to receive as much sunlight as possible in the area occupied by the cell group. Moreover, in the configuration of the present disclosure, each cell in the cell group is connected in parallel with at least one other cell. Therefore, even if the cell is covered with a partial shadow and cannot generate power, if the cell connected in parallel with the cell can generate power, the current generated by the other cells can flow through the cell group. This makes it possible to take out the generated current from the cell group. That is, according to the present disclosure described above, even if one cell in the cell group is covered by a partial shadow, the generated current flows through the cell group, and the electrical energy converted from the solar energy can be taken out.

In the configuration of the present disclosure described above, the cell group may be configured such that a light receiving area of the front surface of each of the solar cells is equal to each other. In that case, the cell group may be configured such that the number of the solar cells connected in each of the parallel connection regions is equal to each other. As a result, when no partial shadow occurs in the cell group, the generated current flowing out from each parallel connection region becomes equal. A situation where the generated current is limited in any one of the cells will not occur. It is possible to efficiently take out solar energy as electrical energy.

The solar panel of the present disclosure described above may include a plurality of the cell groups, and the cell groups may be electrically connected to each other in series or in parallel. As described above, when the light receiving area of the front surface of each of the solar cells is equal to each other, and the number of solar cells connected in each of the parallel connection regions is equal to each other, the number of the solar cells included in each of the cell groups may be equal to each other, and the number of the solar cells connected in each of the parallel connection regions may be equal to each other. According to such a configuration, the generated voltage and generated current obtained in each cell group are equal to each other. Therefore, even if a plurality of cell groups is connected in series or in parallel, the situation where the generated voltage and the generated current of any cell group are limited does not occur. Furthermore, the generated voltage and the generated current of each cell are not limited by the generated voltage and the generated current of other cells. It is thus possible to more efficiently take out solar energy as electrical energy.

In an embodiment of the configuration of the present disclosure described above, the solar panel may further include an insulating material layer to achieve a configuration in which some adjacent cells are electrically connected in parallel and other adjacent cells are electrically connected in series. The connecting element includes an anode connecting element connecting anodes of the solar cells connected in parallel with each other. At a portion where the adjacent parallel connection regions are electrically connected in series in the cell group, the connecting element for electrically connecting two adjacent solar cells may be disposed between the overlapping edge portions of the two solar cells. In the parallel connection regions, with the insulating material layer being provided on the back surface of each of the solar cells on which the anode connecting element is disposed and with the anode connecting element being disposed on a surface of the insulating material layer, the overlapping edge portions of the solar cells connected in parallel with each other may be insulated. The cathode connecting element that connects the cathodes of the solar cells that are connected in parallel with each other may be adhered directly to the back surface of the cells. With such a configuration, it is possible to mix the part where the cells are connected in series and the part where the cells are connected in parallel with a simple configuration in the cell group without arranging a connecting element (for electrical connection between the cells) on the light receiving surface of sunlight (front surface). Finger electrodes for current collection on the front surface of the cells are not connecting elements for electrical connection between the cells, and may be arranged on the front surface.

In the solar panel device having the configuration of the present disclosure described above, a plurality of sets of parallel connection regions in which at least two cells are connected in parallel is connected in series. Therefore, the generated voltage obtained from the cell group can be made higher than in the case where the same area is covered with a single cell. Furthermore, even if a cell in the cell group is covered by a partial shadow and no generated current flows, if a cell connected in parallel with that cell is in a state where generated current flows, the generated current can flow from the other cell. The generated current can be taken out from the cell group, thereby making it possible to obtain power. Regarding this point, the configuration of the present disclosure is advantageously used in a solar panel device mounted on a moving body such as a vehicle. That is, in the case of a solar panel device mounted on a moving body, a partial shadow that changes with each passing moment may occur on the light receiving surface of the panel while the moving body is moving around. In addition, for example, while a moving body equipped with a solar panel in which a plurality of cell groups is arranged side by side is running, elongated partial shadows due to roadside trees, utility poles, advertising towers, etc. occur on the light receiving surface of the panel. Accordingly, as shown in FIG. 5B, one cell may be covered by the partial shadow over a plurality of cell groups. In such a situation where partial shadows occur on the light receiving surface in various manners with each passing moment, if all the cells in a cell group having the shingling structure are connected in series as in the related art, every time one of the cells is covered by a partial shadow, power cannot be taken out from that cell group. In particular, in a moving body equipped with a solar panel in which a plurality of cell groups is arranged side by side, when one cell is covered by a partial shadow over a plurality of cell groups as shown in FIG. 5B, with only one elongated partial shadow occurring on the light receiving surface, power generation energy cannot be obtained from the entire panel, which may hinder stable and sustainable power generation. However, in the configuration of the present disclosure described above, each cell in the cell group is connected in parallel with at least one other cell. Therefore, in one cell group or in all cell groups, even if one cell is covered by a partial shadow, the generated current flows to another cell. It is thus possible to generate power more stably with less interruption.

Other objects and advantages of the present disclosure will become apparent from the following description of embodiments of the present disclosure.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein.

DETAILED DESCRIPTION OF EMBODIMENTS

Configuration of Cell Group with Shingling Structure

Figure 4A:
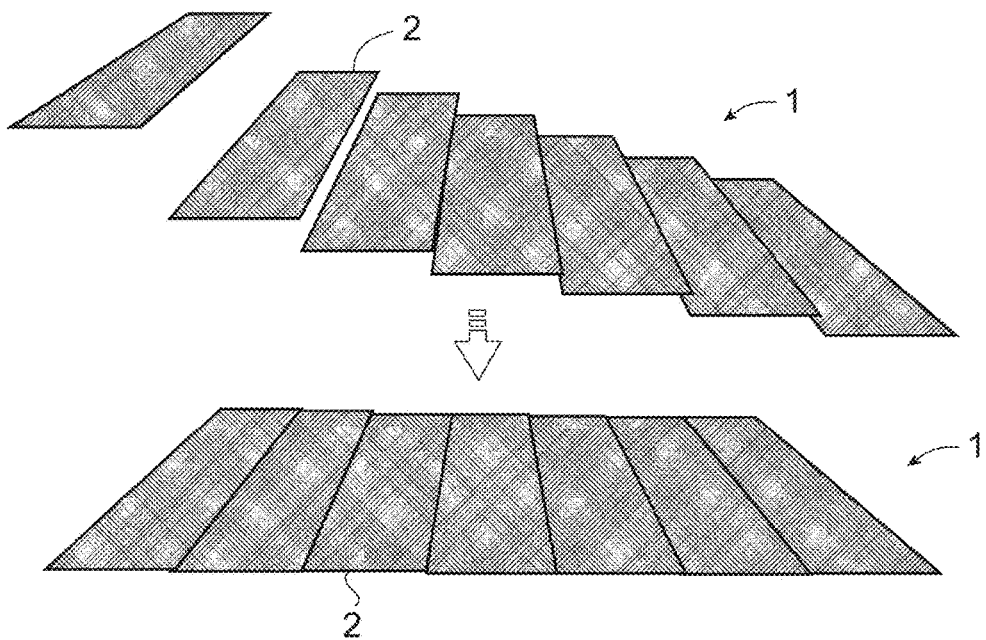
FIG. 4A is a schematic perspective view of a cell group in which cells are arranged in a shingling structure, the upper side being a diagram in which the cells are spaced apart so that the relationship between the overlapping cells can be understood, and the lower side being a diagram of the state in which the cells are overlapped.

Referring to FIG. 4A, as already described above, in a cell group consisting of a plurality of solar cells in a so-called "shingling structure", when the plurality of cells is arranged in one direction, the edge portion of each cell overlaps the edge portion of the adjacent cell. That is, in the drawing, the back surface of the edge portion of the right edge of each cell is placed on the front surface of the edge portion of the left edge of the adjacent cell. In the case of the shingling structure, connecting elements (connecting terminals, conductive wires, connectors, etc.) for electrical connection between cells are generally provided between overlapping edge portions of adjacent cells. It is thus possible to receive sunlight by arranging the light receiving surface in substantially the entire exposed front surface (sunlight reaching area) of the cell group where the sunlight reaches. In the area occupied by the cell group, substantially maximum sunlight can be received. Therefore, the cell group with the shingling structure is advantageous when trying to collect as much solar energy as possible as electrical energy in a limited area such as the roof of a moving body, for example.

Figure 4B:
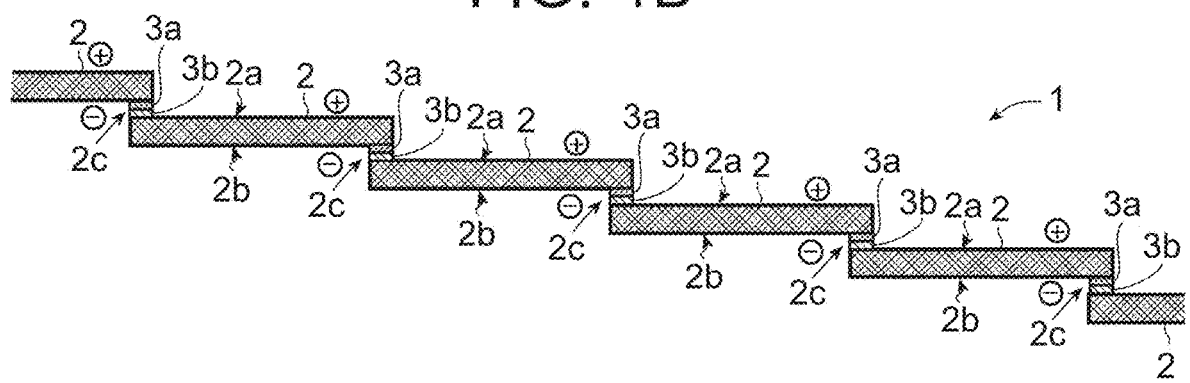
FIG. 4B is a schematic side view of a configuration in which all cells are connected in series in a cell group in which the cells are arranged in a shingling structure.

In the cell group with the shingling structure as described above, in the case of the conventional configuration, all the cells are typically electrically connected in series in the cell group in one row as shown in FIG. 4B. In this case, in an overlapping edge portion 2c between two adjacent cells 2, a cathode terminal 3a of the cell provided on the edge portion of the back surface 2b of the cell placed on the upper side is aligned and connected to an anode terminal 3b of the cell provided on the edge portion of the front surface 2a of the cell placed on the lower side. This configuration is repeated in sequence along the cell group, thereby achieving a series connection of all the cells without the connecting elements between the cells occupying the sunlight reaching area on the top surface of the cell group. However, in the case of a cell group in which all the cells are connected in series as described above, all the cells have a common current, as can be understood from the circuit diagram of FIG. 4C. The current flowing through the cell group is therefore limited to the magnitude of the current flowing through the cell with the smallest generated current among the cells connected in series. If all the cells are evenly irradiated by the sunlight, the current is not limited in any of the cells. However, if the amount of light received by one cell in the cell group is reduced due to a partial shadow or the like, the generated current of that cell is reduced. Furthermore, the overall current flowing through the cell group is reduced, and the electrical energy that can be taken out from the cell group is reduced. When a partial shadow that completely covers one cell is formed, current cannot be taken out from the cell group to which the cell belongs, and electrical energy cannot be obtained.

Figure 4C:
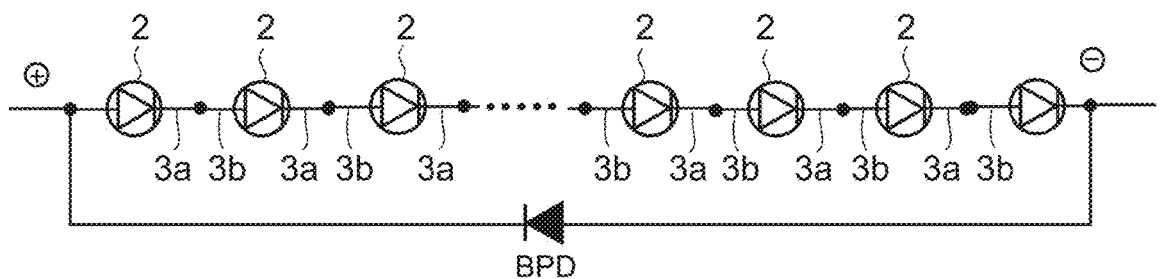
FIG. 4C is a wiring diagram of a configuration in which all the cells are connected in series.
Figure 5A:
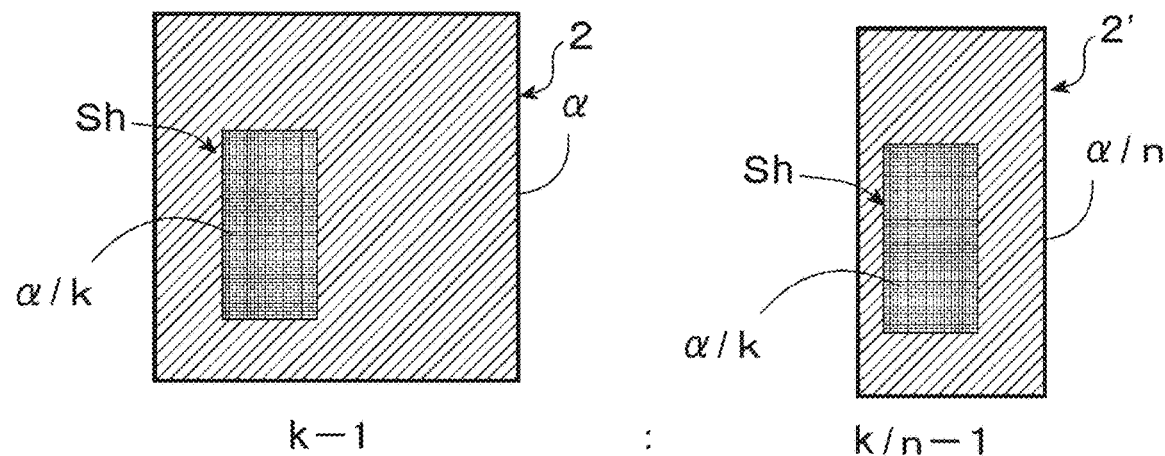
FIG. 5A is a plan view of cells schematically showing a state in which a partial shadow of the same size is formed in cells having different areas.

In this regard, in the cell group with the shingling structure, the light receiving area of each cell is generally relatively small. When a partial shadow of the same area is formed over cells with different areas, the smaller the area of the cell, the greater the decrease rate of the current. For example, as depicted in FIG. 5A, in a cell with an area α (left) and a cell with an area α/n (right) (n is a positive number greater than 1), when the partial shadow Sh with the area α/k occurs (k>n), the current is (k−1)/k times in the cell of area α. The current is (k/n−1)k times in the cell of area α/n. The decrease rate of the current is greater in the latter. That is, when the area of each cell is small as in a cell group having a shingling structure, the decrease rate of the current due to a partial shadow of a certain area is relatively large. Accordingly, the current flowing through the cell group is likely to decrease. When a bypass diode BPD is connected in parallel across both ends of the cell group 1 as shown in FIG. 4C, when the current that can flow through the cell group 1 decreases, the current flows through the bypass diode BPD. That is, the cell group 1 will not output any power.

Figure 5B:
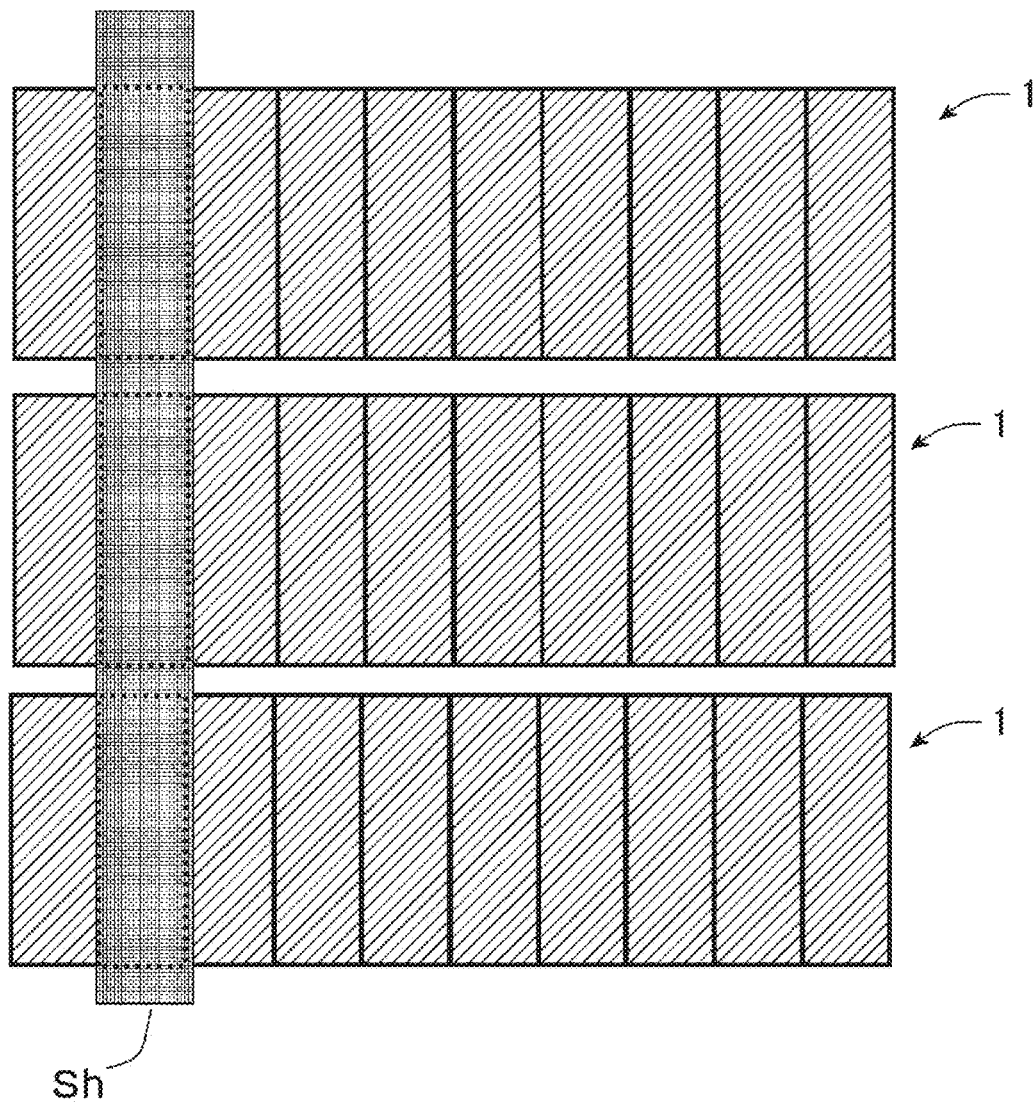
FIG. 5B is a schematic plan view of a plurality of cell groups arranged side by side, showing a state in which an elongated partial shadow is formed over all cell groups.

Furthermore, for example, as shown in FIG. 5B, in a solar panel in which a plurality of cell groups 1 is arranged side by side and all the plurality of cells in each cell group is connected in series, when an elongated partial shadow Sh extending over the cell groups is formed as shown in the figure, power cannot be taken out from all of the cell groups even though only one cell is in the partial shadow in each cell group. Such an elongated partial shadow Sh may often appear on the roof of a moving body such as a vehicle due to the shadows of roadside trees and utility poles while the moving body is moving. In a configuration in which a solar panel as shown in FIG. 5B is mounted on the roof of a moving body, a state in which no power is obtained frequently occurs every time such an elongated partial shadow Sh appears while the moving body is moving.

Configuration of Cell Group with Shingling Structure According to Present Embodiment As described above, when all the cells in the cell group are connected in series, if even one cell in the cell group is covered with a partial shadow, no current flows through the cell group and the power cannot be collected. Therefore, in the present embodiment, in a cell group in which a plurality of cells is arranged to form a shingling structure, each cell is connected in parallel with at least one other cell, and electrical connections are made between cells so that the sets of the cells connected in parallel with each other (parallel connection regions) are connected in series. According to such a configuration, even if a certain cell in the cell group is covered with a partial shadow and the generated current does not flow therethrough, unless another cell connected in parallel with that cell is covered with a partial shadow, the generated current flows through the cell group through the other cell. A state in which power can be taken out from the cell group is maintained.

Figure 1A:
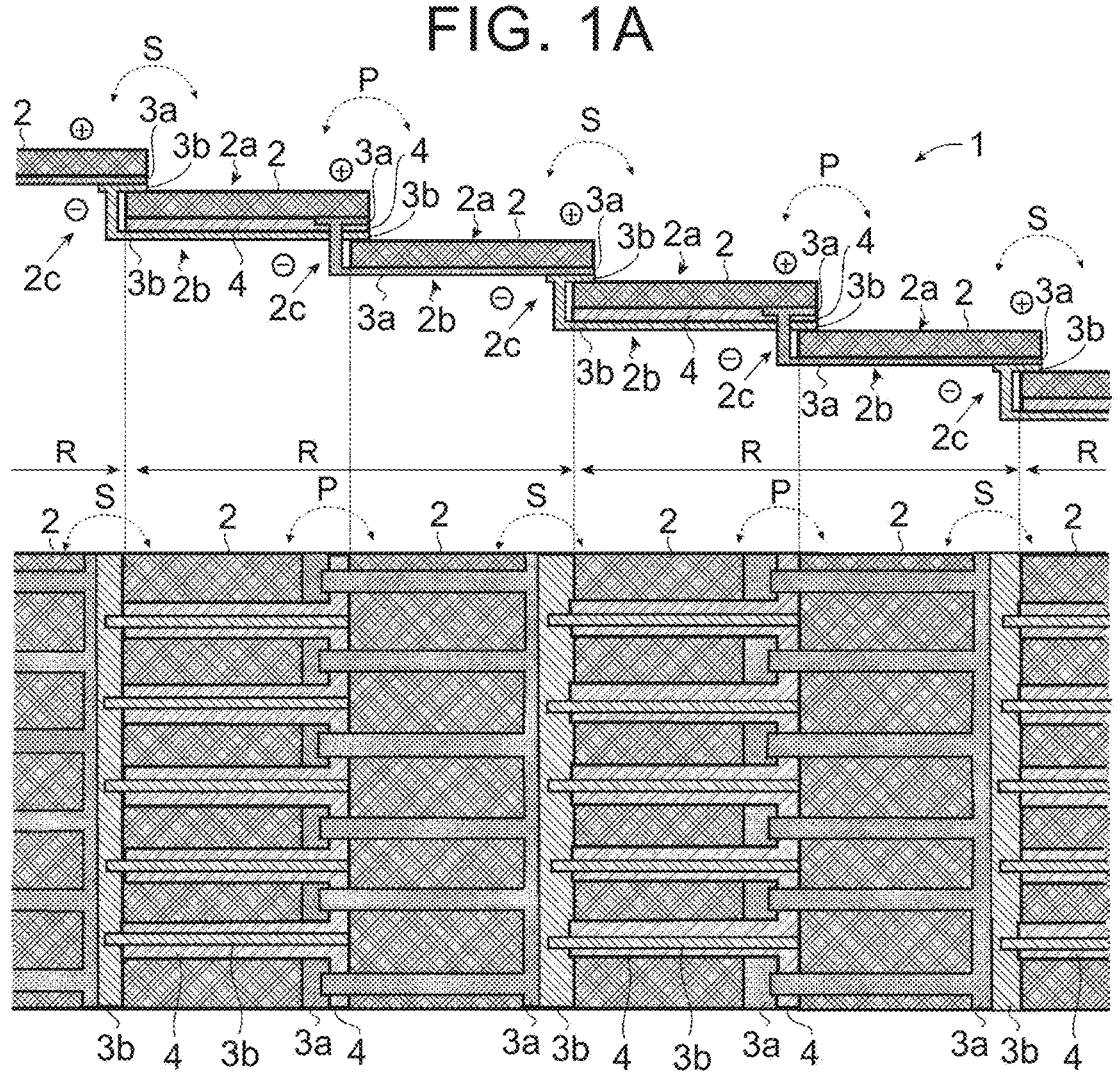
FIG. 1A is a schematic diagram of a solar panel according to the present embodiment, with a side view on the upper side and a bottom view on the lower side.

Specifically, in the case where the cell group in the solar panel device according to the present embodiment is viewed from the front surface, as described with reference to FIG. 4A, the edge portion of each cell overlaps the edge portion of the adjacent cell when the plurality of cells 2 is arranged in one direction. That is, in the drawing, the back surface of the edge portion of the right edge of each cell is placed on the front surface of the edge portion of the left edge of the adjacent cell. The light receiving surface is provided over substantially the entire sunlight reaching area of the cell group 1. In the area occupied by the cell group, substantially maximum sunlight can be received. However, in the case of the present embodiment, as schematically depicted in FIG. 1A, a cathode connector 3a and an anode connector 3b for connecting between the cells are disposed between the edge portions 2c where adjacent cells 2 overlap each other and on the back surface 2b of each cell 2, so that the adjacent cells 2 are electrically connected in parallel with each other at the portion between the cells denoted by P (parallel connection portion) and the adjacent cells 2 are electrically connected in series with each other at the portion between the cells denoted by S (series connection portion). In the present embodiment, the cell group 1 arranged in the shingling structure constitutes a plurality of sets of regions (parallel connection regions) R in which adjacent cells 2 are connected in parallel. Wiring is performed between the cells so that the parallel connection regions R are connected in series.

Referring to FIG. 1A, the configuration in which the parallel connection regions R, in which the adjacent cells 2 are connected in parallel as described above, are connected in series is achieved by placing, for example, the cathode connector 3a and the anode connector 3b as follows. First, in each of the series connection portions S where the cells are connected in series, the cathode connector 3a is disposed on the back surface 2b of the cell 2 overlapping on the upper side (located on the left in the drawing), so as to extend over the entire length of the cell 2 in the extending direction of the cell group 1. At the series connection portion S, the end of the cathode connector 3a is facingly aligned with and contacts the end of the anode connector 3b disposed at the edge portion of the front surface 2a of the cell 2 overlapped on the lower side of the end of the cathode connector 3a (located on the right in the drawing). This achieves a series connection between two adjacent cells 2 at the overlapping edge portion 2c. Next, in the cell 2 overlapped on the lower side of each series connection portion S, the anode connector 3b is disposed so as to extend downward from the end of the front surface 2a of the overlapping edge portion 2c of the series connection portion S along the side edge of that cell 2 and extend along the back surface 2b of the cell 2 to the other edge portion where the parallel connection portion P is formed, over the entire length of the cell 2 in the extending direction of the cell group 1 (to the right in the figure). In the cell 2 overlapped on the lower side in the series connection portion S, an insulating material layer 4 is laminated on the back surface 2b as shown in the drawing. The anode connector 3b is disposed on the surface of the insulating material layer 4. This electrically insulates between the back surface 2b and the anode connector 3b.

On the other hand, in each parallel connection portion P, the anode connector 3b is disposed via an insulating material layer 4 so as not to contact the back surface 2b of the cell 2 overlapping on the upper side (located on the left in the figure). The end of the anode connector 3b is brought into contact with the edge portion of the front surface 2a of the cell 2 overlapped on the lower side (located on the right in the drawing). The anode connector 3b is brought into contact with the front surface 2a of the cell 2 at the overlapping edge portion 2c at the other end (at the series connection portion S in the figure) of the cell 2 overlapping on the upper side. Accordingly, at the parallel connection portion P, the front surfaces 2a, which are the anodes of the cell 2 overlapping on the upper side and the cell 2 overlapped on the lower side, are connected to each other. At each parallel connection portion P, the cathode connector 3a that is in contact with the back surface 2b of the cell 2 overlapped on the lower side extends upward from the back surface 2b of the cell 2 through a side wall to contact the back surface 2b of the cell 2 overlapping on the upper side, without contacting the anode connector 3b. Accordingly, at the parallel connection portion P, the back surfaces 2b, which are the cathodes of the cell 2 overlapping on the upper side and the cell 2 overlapped on the lower side, are connected to each other. Thus, a parallel connection between two cells 2 adjacent to each other in the parallel connection portion P is achieved.

Figure 1B:
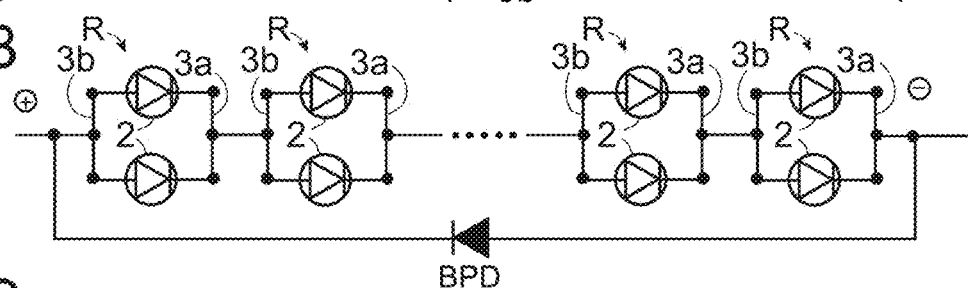
FIG. 1B is a wiring diagram of one mode of the solar panel according to the present embodiment.

As described above, in the cell group 1 according to the present embodiment, as shown in the circuit diagram of FIG. 1B, a configuration is achieved in which a plurality of parallel connection regions R is formed in which adjacent cells 2 are connected in parallel, and the parallel connection regions R are connected in series. According to the above configuration, the cathode connector 3a and the anode connector 3b for electrically connecting the cells are disposed between the overlapped edge portions 2c between the cells and the back surface 2b of each cell 2. The exposed sunlight reachable area of the front surface 2a of each cell 2 can be free of anything except finger electrodes (not shown). This makes it possible to arrange the light receiving surfaces of the cells so as to receive the maximum amount of sunlight in the area occupied by the cell group. The cathode connector 3a and the anode connector 3b may have shapes other than the illustrated example. Such a case also belongs to the scope of the present embodiment.

Solar batteries that can be used in the present embodiment may be of any type, and silicon-based solar batteries such as crystalline silicon solar batteries that are commonly used in this field, compound-based solar batteries such as GaAs batteries, organic solar batteries, multi-junction solar batteries, quantum dot solar batteries, and the like may be used. As shown in FIG. 1B, a bypass diode BPD may be connected in parallel across both ends of the cell group.

Also, in the examples of FIGS. 1A and 1B, two cells are connected in parallel in one parallel connection region. However, any number of cells may be connected in one parallel connection region. For example, three or more cells may be connected in parallel in one parallel connection region, as shown in FIG. 1C.

Each cell used in the cell group 1 according to the present embodiment described above does not necessarily have to be manufactured by dividing one large cell.

Figure 1C:
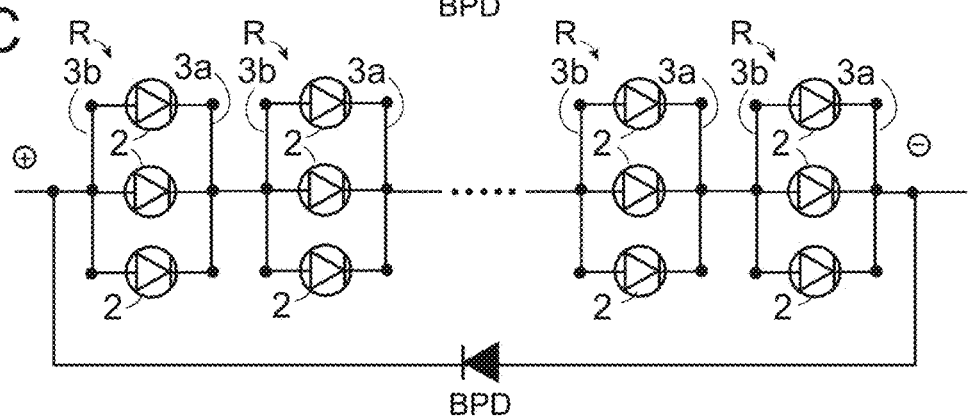
FIG. 1C is a wiring diagram of another mode of the solar panel according to the present embodiment.

As can be understood from the circuit diagrams of FIGS. 1B and 1C, in the cell group 1 according to the present embodiment, a plurality of parallel connection regions R is connected in series. The light receiving area of each parallel connection region R may be adjusted so that the generated current of each parallel connection region R is equal and the generated current is not limited in any of the parallel connection regions R when no shadow is formed on the light receiving surface. When cells having the same light receiving area are used in a cell group, the number of cells connected in parallel in each parallel connection region R may be equal.

Voltage-Output Characteristics of Cell Group

Figure 2:
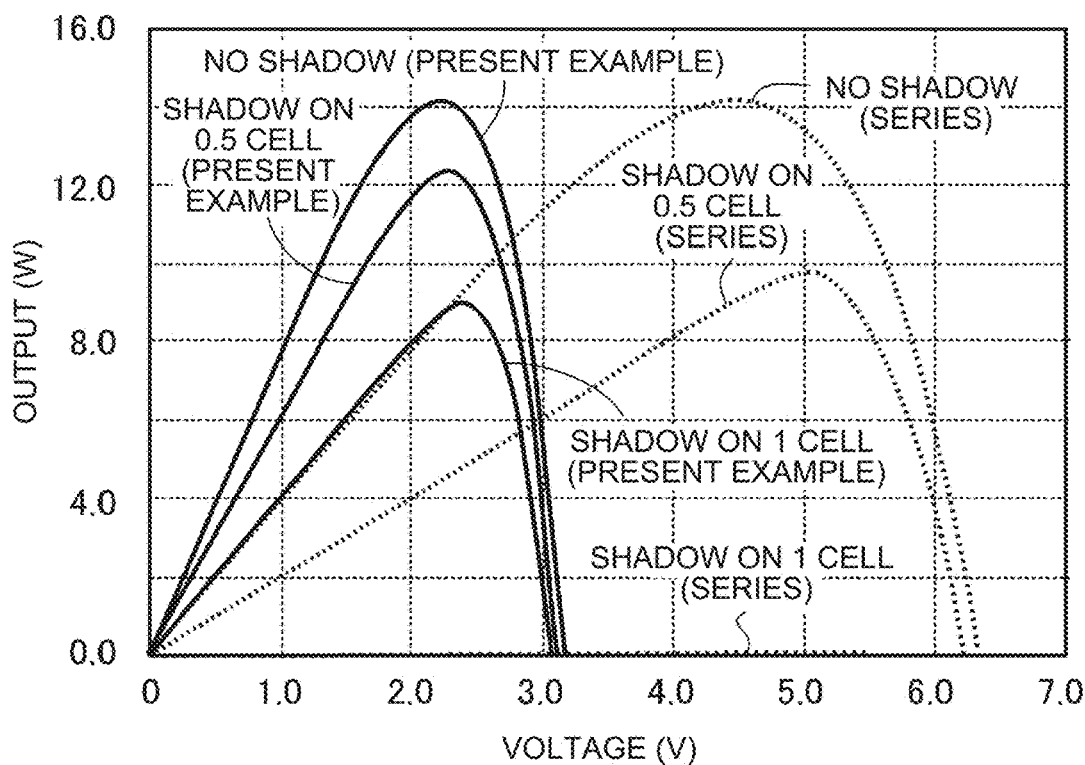
FIG. 2 is a diagram showing voltage-output characteristics between both ends of a cell group in which 10 cells are arranged in a shingling structure when there is no shadow (no shadow), when half of one cell is covered with shadow (shadow on 0.5 cell), and when one cell is entirely covered (shadow on 1 cell), the configuration being either a configuration in which the cells are connected according to the present embodiment (present example) or a configuration in which all the cells are connected in series (series)

FIG. 2 is a diagram showing the voltage-output characteristics obtained in a cell group in which 10 cells having the same light receiving area are arranged in a shingling structure. The voltage and output in the figure were calculated by simulation calculation. The figure shows the case where all the cells with the shingling structure are connected in series (series—dotted line) as in the related art and the case where five sets of regions in which two cells are connected in parallel are connected in series (present example—solid line) with the shingling structure in accordance with the present embodiment. The output for the power generation voltage is shown for cases where there is no partial shadow (no shadow), half of a cell is covered by a partial shadow (shadow on 0.5 cell), and the entire area of a cell is covered by a partial shadow (shadow on 1 cell). With reference to the figure, when there is no partial shadow, the obtained output is the same in the case where all the cells are connected in series and in the case of the present embodiment. When one cell is partially or entirely covered by a partial shadow, if all the cells are connected in series, the generated current of the entire cell group is limited to the current of the cell with the lowest current. Therefore, the range of decrease in the output obtained is large. When the entire area of one cell is covered by a partial shadow, no current flows through the entire cell group and no power can be obtained from the cell group. On the other hand, in the case of the present embodiment, even if one cell is partially or entirely covered with a partial shadow, the current flows through the cells connected in parallel to that cell. Therefore, the range of decrease in the output is relatively small. Even if the entire area of one cell is covered with a partial shadow, the current flows through the entire cell group, which maintains the state in which power can be obtained from the cell group. Thus, with the cell group of the present embodiment, when the solar panel device is mounted on the roof or the like of a moving body where partial shadows may vary, it is expected that the cases of a complete loss of power can be greatly reduced.

Connection of Multiple Cell Groups

Figure 3:
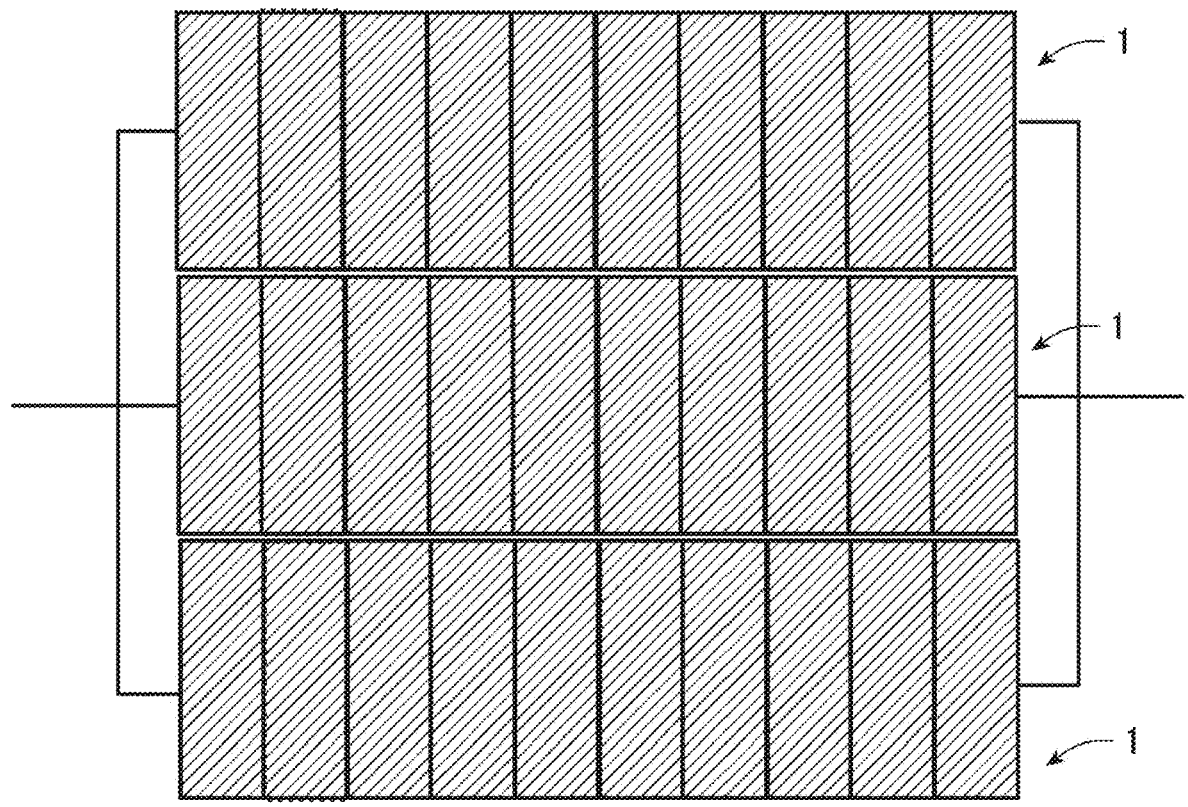
FIG. 3 is a schematic plan view of a state in which a plurality of cell groups of the present embodiment is connected.

A plurality of cell groups 1 of the present embodiment may be connected in parallel as illustrated in FIG. 3 or in series (not shown). When a plurality of cell groups 1 is connected in series, the generated current of each cell group 1 may be substantially equal so as not to be subject to limitations of current by other cell groups 1. When a plurality of cell groups 1 is connected in parallel, the generated voltage of each cell group 1 may be substantially equal so that any cell group 1 can be operated at a highly efficient operating point. Therefore, when forming a cell group with cells having the same light receiving area, it is possible that, in all the cell groups, the number of cells is the same, the number of cells connected in each parallel connection region is the same, and the number of parallel connection regions connected in series is the same.

As already mentioned, the cell group of the present embodiment can be used in solar panels mounted on moving bodies, but may also be used in other applications. The present embodiment can also be used when the solar panel is placed in a location where the space it can occupy is limited and partial shadows occur over time, and also for portable panels.

Although the above description has been made with respect to the embodiment of the present disclosure, many modifications and changes can be made by those skilled in the art. The present disclosure is not limited to only the above-exemplified embodiment, but applies to various devices without departing from the concept of the present disclosure.

What is claimed is:

1. A solar panel comprising a cell row, the cell row including a plurality of cell groups, each cell group of the plurality of cell groups including:
   a plurality of cells, each cell of the plurality of cells having a first end and a second end in a longitudinal direction of the cell row;
   a second end of a first cell of the plurality of cells overlapping a first end of a second cell of the plurality of cells;
   a first connector electrically connecting an anode surface of the first cell and an anode surface of the second cell;
   a second connector electrically connecting a cathode surface of the first cell and a cathode surface of the second cell; and
   an insulator provided between the first connector and the second connector, wherein
   the second connector of a first cell group of the plurality of the cell groups is electrically connected to the first connector of a second cell group of the plurality of the cell groups.

2. The solar panel according to claim 1, wherein
   the second connector is connected to the cathode surface at the second end of the first cell,
   the second connector is connected to and extends along the cathode surface of the second cell, and
   the first connector of the second cell group is connected to the second connector of the first cell group at the second end of the second cell.

3. The solar panel according to claim 1, wherein
   surface areas of light receiving areas of the anode surfaces of the cells are equal to each other, and
   a number of the cells included in the cell groups are equal to each other.

4. The solar panel according to claim 3, wherein
   the solar panel includes a plurality of cell rows, and the cell rows are electrically connected to each other in series or in parallel, and
   a number of the cells included in the cell rows are equal to each other.

* * * * *